(12) United States Patent
Zhang et al.

(10) Patent No.: US 10,847,737 B2
(45) Date of Patent: Nov. 24, 2020

(54) LIGHT DETECTOR

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/916,418

(22) Filed: Mar. 9, 2018

(65) Prior Publication Data

US 2018/0342690 A1 Nov. 29, 2018

(30) Foreign Application Priority Data

May 24, 2017 (CN) .......................... 2017 1 0374706

(51) Int. Cl.

| | |
|---|---|
| *H01L 51/42* | (2006.01) |
| *H01L 51/00* | (2006.01) |
| *H01L 31/0224* | (2006.01) |
| *H01L 31/11* | (2006.01) |
| *H01L 51/44* | (2006.01) |
| *H01L 31/113* | (2006.01) |
| *B82Y 15/00* | (2011.01) |
| *B82Y 30/00* | (2011.01) |

(52) U.S. Cl.
CPC .... *H01L 51/428* (2013.01); *H01L 31/022408* (2013.01); *H01L 31/022466* (2013.01); *H01L 31/11* (2013.01); *H01L 31/113* (2013.01); *H01L 51/0048* (2013.01); *H01L 51/0052* (2013.01); *H01L 51/424* (2013.01); *H01L 51/4213* (2013.01); *H01L 51/444* (2013.01); *B82Y 15/00* (2013.01); *B82Y 30/00* (2013.01)

(58) Field of Classification Search
CPC ................................. H01L 51/42; H01L 51/00
USPC ........................................................ 257/432
See application file for complete search history.

(56) References Cited

U.S. PATENT DOCUMENTS

| | | |
|---|---|---|
| 2008/0178924 A1 | 7/2008 | Kempa et al. |
| 2009/0260679 A1 | 10/2009 | Sun et al. |
| | (Continued) | |

FOREIGN PATENT DOCUMENTS

| | | |
|---|---|---|
| CN | 101667611 A | 3/2010 |
| CN | 105489694 A | 4/2016 |
| | (Continued) | |

*Primary Examiner* — Sheng-Bai Zhu
(74) *Attorney, Agent, or Firm* — ScienBiziP, P.C.

(57) ABSTRACT

A light detector includes a semiconductor element, a first electrode, a second electrode and a current detecting element electrically connected with each other to form a circuit. The semiconductor element includes a semiconductor structure, a carbon nanotube and a transparent conductive film. The semiconductor structure includes a P-type semiconductor layer and an N-type semiconductor layer and defines a first surface and a second surface. The carbon nanotube is located on the first surface of the semiconductor. The transparent conductive film is located on the second surface of the semiconductor. The transparent conductive film is formed on the second surface by a depositing method or a coating method.

18 Claims, 4 Drawing Sheets

(56) References Cited

U.S. PATENT DOCUMENTS

| | | | |
|---|---|---|---|
| 2010/0206362 A1* | 8/2010 | Flood | H01L 31/0336 |
| | | | 136/252 |
| 2011/0253982 A1 | 10/2011 | Wang et al. | |
| 2011/0287977 A1* | 11/2011 | Cai | G01N 33/54346 |
| | | | 506/13 |
| 2012/0042952 A1 | 2/2012 | Yi et al. | |
| 2012/0199892 A1* | 8/2012 | Chiang | B82Y 10/00 |
| | | | 257/290 |
| 2013/0015547 A1* | 1/2013 | Hamano | H01L 27/14643 |
| | | | 257/436 |
| 2014/0217536 A1* | 8/2014 | Liu | H01L 31/0224 |
| | | | 257/432 |
| 2015/0270299 A1* | 9/2015 | Gao | H01L 27/1214 |
| | | | 257/72 |
| 2018/0102481 A1* | 4/2018 | King | H01L 51/0036 |
| 2018/0219047 A1* | 8/2018 | Tokuhara | G01J 1/0407 |

FOREIGN PATENT DOCUMENTS

| | | |
|---|---|---|
| CN | 205376554 | 7/2016 |
| JP | 2004-64028 A | 2/2004 |
| JP | 2008-55375 | 3/2008 |
| JP | 2010-93118 | 4/2010 |
| JP | 2012-525699 A | 10/2012 |
| TW | 200845404 A | 11/2008 |
| TW | 200947722 A | 11/2009 |

\* cited by examiner

LIGHT DETECTOR

CROSS-REFERENCE TO RELATED APPLICATIONS

This application claims all benefits accruing under 35 U.S.C. § 119 from China Patent Application No. 201710374706.8, filed on May 24, 2017, in the China Intellectual Property Office, the contents of which are hereby incorporated by reference.

FIELD

The present disclosure relates to a light detector.

BACKGROUND

A light detector is a device that detects light energy. The working principle of a general light detector is based on the photoelectric effect, which changes the electrical properties of the material after it has absorbed the radiant energy of the light, so that the presence of light and the amount of light energy can be detected. Semiconductor device can be used in the light detector. However, due to technical limitations, the semiconductor devices are often micrometer structures, which limits the size of the light detector and affects the application range of the light detector.

BRIEF DESCRIPTION OF THE DRAWINGS

Implementations of the present technology will now be described, by way of example only, with reference to the attached figures, wherein.

DETAILED DESCRIPTION

Figure 1:
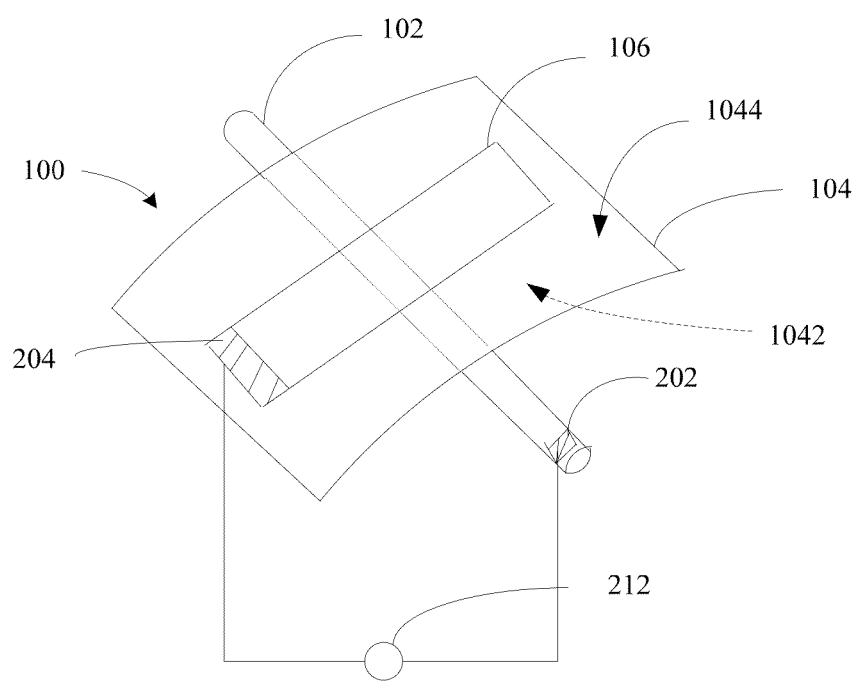
FIG. 1 is a structure schematic view of one embodiment of a light detector.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Referring to FIG. 1, one embodiment is described in relation to a light detector 10. The light detector 10 includes a semiconductor element 100, a first electrode 202, a second electrode 204 and a current detecting element 212. The semiconductor element 100, the first electrode 202, the second electrode 204 and the current detecting element 212 are electrically connected with each other to form a circuit. In the circuit, the first electrode 202 and the second electrode 204 are electrically connected with the current detecting element 212 with lead wires. The semiconductor element 100 includes a semiconductor structure 104, a carbon nanotube 102 and a transparent conductive film 106. The semiconductor structure 104 is located between the carbon nanotube 102 and the transparent conductive film 106. In one embodiment, the light detector 10 consists of the carbon nanotube 102, the semiconductor structure 104 and the transparent conductive film 106. A thickness of the semiconductor structure 104 ranges from 1 nanometer to about 20000 nanometers. In one embodiment, the thickness of the semiconductor 104 ranges from 1 nanometer to about 10000 nanometers. The semiconductor structure 104 has a film structure defining a first surface 1042 and a second surface 1044. The first surface 1042 and the second surface 1044 are two opposite surfaces. The carbon nanotube 102 is oriented along a first direction and located on the first surface 1042. In one embodiment, there is only one carbon nanotube 102 located on the first surface 1042. The transparent conductive film 106 is located on the second surface 1044.

The carbon nanotube 102 is a metallic carbon nanotube. The carbon nanotube 102 can be a single-walled carbon nanotube, a double-walled carbon nanotube, or a multi-walled carbon nanotube. A diameter of the carbon nanotube 102 can range from about 0.5 nanometers to about 150 nanometers. In one embodiment, the diameter of the carbon nanotube 102 ranges from about 1 nanometer to about 10 nanometers. In another embodiment, the carbon nanotube 102 is a single-walled carbon nanotube, and the diameter of the carbon nanotube 102 is in a range from about 1 nanometer to about 5 nanometers. In one embodiment, the carbon nanotube 102 is a metallic single-walled carbon nanotube, and the diameter of the carbon nanotube 102 is about 1 nanometer.

Figure 2:
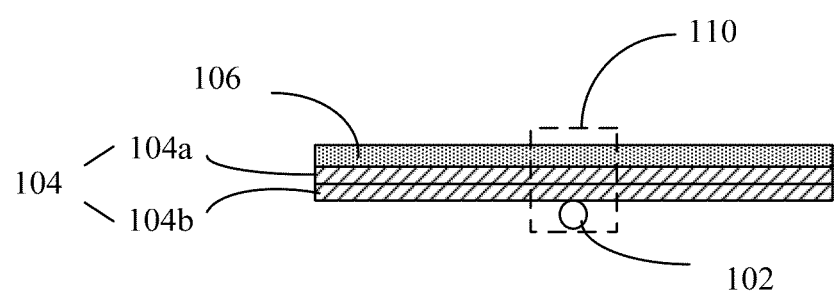
FIG. 2 is a side structure schematic view of the light detector in FIG. 1 according to one embodiment.
Figure 3:
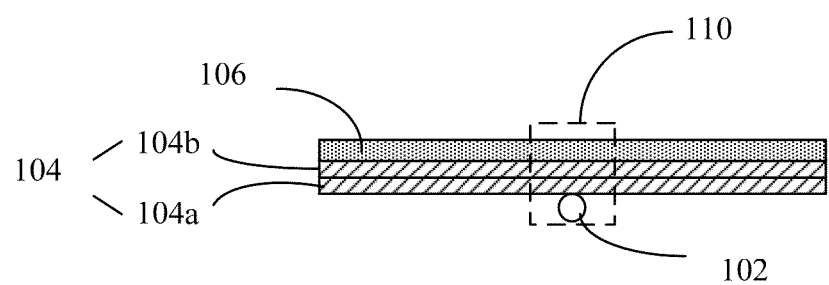
FIG. 3 is a side structure schematic view of the light detector in FIG. 1 according to another embodiment.

The semiconductor structure 104 can be a two-dimensional structure. The semiconductor structure 104 includes a P-type semiconductor layer 104a and an N-type semiconductor layer 104b. The P-type semiconductor layer 104a and the N-type semiconductor layer 104b are overlapped with each other. Referring to FIG. 2, in one embodiment, the first surface 1042 of the semiconductor structure 104 is a surface of the P-type semiconductor layer 104a, the second surface 1044 of the semiconductor structure 104 is a surface of the N-type semiconductor layer 104b. The carbon nanotube 102 is located on the surface of the P-type semiconductor layer 104a, the transparent conductive film 106 is located on the surface of the N-type semiconductor layer 104b. Referring to FIG. 3, in another embodiment, the first surface 1042 of the semiconductor structure 104 is the surface of the N-type semiconductor layer 104b, the second surface 1044 of the semiconductor structure 104 is the surface of the P-type semiconductor layer 104a. The carbon nanotube 102 is located on the surface of the N-type semiconductor layer 104b, the transparent conductive film 106 is located on the surface of the P-type semiconductor layer 104a. A material of the P-type semiconductor layer 104a or the N-type semiconductor layer 104b can be inorganic compound semiconductors, elemental semiconductors or organic semiconductors, such as gallium arsenide, silicon carbide, polysilicon, monocrystalline silicon, naphthalene or molybdenum sulfide. In one embodiment, the material of the N-type semiconductor layer 104b is Molybdenum sulfide ($MoS_2$), and the thickness of the N-type semiconductor layer 104b is about 2.6 nanometers; the material of the P-type semiconductor layer 104a is Tungsten selenide (Wse2), and the thickness of the P-type semiconductor layer 104a is 6 nanometers.

A material of the transparent conductive film 106 can be metal, conductive polymer or ITO. The transparent conductive film 106 is directly deposited on or coated on the second surface 1044 of the semiconductor structure 104. A method of depositing the transparent conductive film 106 on the first surface 1044 of the semiconductor structure 104 is not limited, and can be ion sputtering or magnetron sputtering. A thickness of the transparent conductive film 106 is not limited, and can be in a range from 5 nanometers to 100 micrometers. In some embodiments, the thickness of the transparent conductive film 106 is in a range from 5 nanometers to 100 nanometers. In other embodiments, the thickness of the transparent conductive film 106 is in a range from 5 nanometers to 20 nanometers. A shape of the transparent conductive film 106 is not limited, and can be bar, linear, square, or the like. In one embodiment, the transparent conductive film 106 is strip-shaped.

The first electrode 202 and the second electrode 204 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 202 and the second electrode 204 are both conductive films. A thickness of the conductive film ranges from about 2 microns to about 100 microns. In this embodiment, the first electrode 202 and the second electrode 204 are metal composite structures of Au and Ti. Specifically, the metal composite structure includes an Au layer and a Ti layer overlapped with each other. The Ti layer has a thickness of 5 nm and the Au layer has a thickness of 50 nm. In this embodiment, the first electrode 202 is electrically connected to the carbon nanotube 102 and located at one end of the carbon nanotube 102 and adhered to the surface of the carbon nanotube 102. The Ti layer is located on the surface of the carbon nanotube 102, the Au layer is located on a surface of the Ti layer. The second electrode 204 is electrically connected to the transparent conductive film 106 and located on one end of the transparent conductive film 106 and adhered on the surface of the transparent conductive film 106, wherein the Ti layer is located on the surface of the transparent conductive film 106, the Au layer is located on the surface of the Ti layer.

A multi-layered stereoscopic structure 110 is formed by the carbon nanotube 102, the semiconductor structure 104 and the transparent conductive film 106. A cross-sectional area of the multi-layered stereoscopic structure 110 is determined by the carbon nanotube 102. Because the carbon nanotube 102 is in nanoscale, an the cross-sectional area of the multi-layered stereoscopic structure 110 is nanoscale. The multi-layered stereoscopic structure 110 defines a first cross-sectional surface and a second cross-sectional surface. The first cross-sectional surface is parallel with the surface of the semiconductor structure 104. The second cross-sectional surface is perpendicular with the surface of the semiconductor structure 104. That is, the first cross-sectional surface is perpendicular with the second cross-sectional surface. An area of the first cross-sectional surface is determined by the diameter of the carbon nanotube 102 and a thickness of the multi-layered stereoscopic structure 110. An area of the second cross-sectional surface is determined by the length of the carbon nanotube 102 and the thickness of the multi-layered stereoscopic structure 110. In one embodiment, the cross-sectional area of the multi-layered stereoscopic structure 110 ranges from about 0.25 $nm^2$ to about 1000 $nm^2$. In another embodiment, the cross-sectional area of the multi-layered stereoscopic structure 110 ranges from about 1 $nm^2$ to about 100 $nm^2$.

The light detector 10 can qualitatively and quantitatively detect light. When the light detector 10 is used to qualitatively detect light, a working principle of the light detector 10 is discussed below. There is no conduction between the carbon nanotube 102, the semiconductor structure 104 and the transparent conductive film 106 when no light emitted on the light detector 10, and no current can be detected by the current detecting element 212 in the circuit. When a light is emitted on the light detector 10, photogenerated carriers are generated in the semiconductor layer 104. The photogenerated carriers includes electrons and holes, which are separated by a built-in electric field formed between the carbon nanotube 102 and the transparent conductive film 106, so that a photo-generated current is formed. That is, a current is generated in the circuit is detected by the current detecting element 212.

When the light detector 10 is used to quantitatively detect light, a working principle of the light detector 10 is discussed below. The light detector 10 is irradiated with light of known intensity, and the current value detected by the current detecting element 212 is read out. The light intensity is corresponding to the current value, and light with different intensity is corresponding to current with different intensity. As such, a graph of current value and light intensity can be obtained. When the light detector 10 is irradiated with light of unknown intensity, the intensity value of the light can be read out from the graph based on the current value detected by the current detecting element 212.

In the light detector 10, a Wan der Waals heterostructure is formed by the multi-layered stereoscopic structure 110 between the carbon nanotube 102, the semiconductor structure 104 and the transparent conductive film 106. In use of the light detector 10, a Schottky junction is formed between the carbon nanotube 102, the semiconductor structure 104 and the transparent conductive film 106 in the multi-layered stereoscopic structure 110. The carbon nanotube 102 and the transparent conductive film 106 can be regarded as two electrodes located on surfaces of the semiconductor structure 104. The semiconductor structure 104 is a P-N junction. When the light is emitted on the multi-layered stereoscopic structure 110, a current can get through the multi-layered stereoscopic structure 110. The current flows along the multi-layered stereoscopic structure 110. A working part of the light detector 10 is multi-layered stereoscopic structure 110. As such, a size of the light detector 10 is larger than or equal to the multi-layered stereoscopic structure 110. As such, the light detector 10 is in nanoscale.

Figure 4:
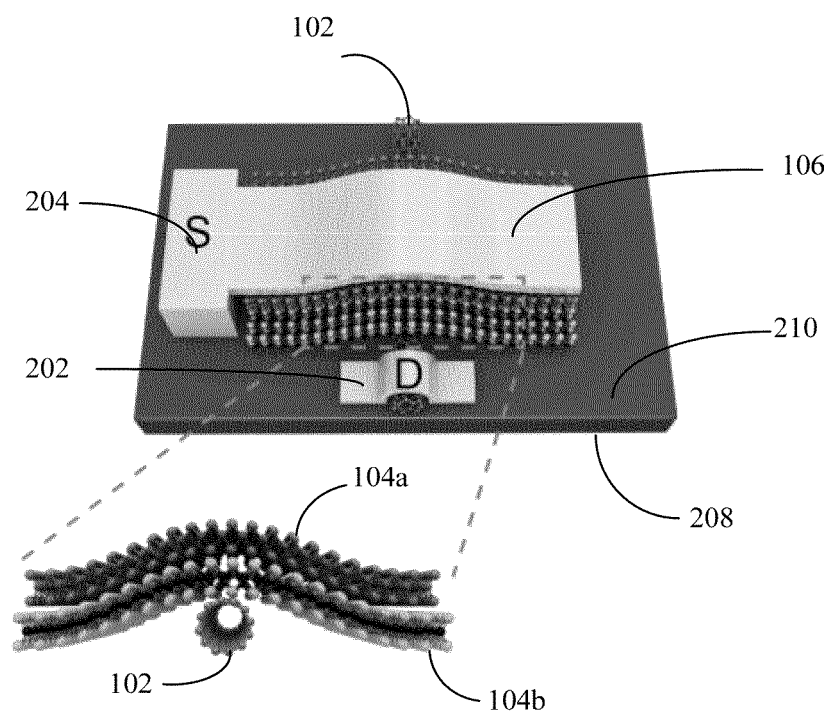
FIG. 4 is a structure schematic view of another embodiment of a light detector.

Referring to FIG. 4, according to another embodiment, the light detector 10 can further include a gate electrode 208 and an insulating layer 210. The gate electrode 208 is insulated from the semiconductor element 100, the first electrode 202 and the second electrode 204 through the insulating layer 210.

In the light detector 10, the gate electrode 208 and the insulating layer 210 are stacked, and the semiconductor element 100 is located on a surface of the insulating layer 210, the insulating layer 210 is located between the gate electrode 208 and the semiconductor element 100. In the semiconductor element 100, the carbon nanotube 102 are directly located on the surface of the insulating layer 210, the semiconductor structure 104 is located above the carbon nanotubes 102, the carbon nanotubes 102 are located between the semiconductor structure 104 and the insulating layer 210, and the transparent conductive film 106 is located above the semiconductor structure 104.

The insulating layer 210 is made of an insulating material and has a thickness of 1 nanometer to 100 micrometers. The insulating layer 210 provides the insulation between the carbon nanotubes 102 and the gate electrode 208. In this embodiment, the material of the insulating layer 210 is silicon oxide.

The gate electrode 208 is made of a conductive material. The conductive material may be selected from the group consisting of metal, ITO, ATO, conductive silver paste, conductive polymer, and conductive carbon nanotube. The metallic material may be aluminum, copper, tungsten, molybdenum, gold, titanium, palladium or any combination of alloys. In this embodiment, the gate electrode 208 is a layered structure, the insulating layer 210 is located on the surface of the gate electrode 208. The first electrode 202, the second electrode 204, and the semiconductor element 100 are located on the insulating layer 210, and are supported by the gate electrode 208 and the insulating layer 210. In the present disclosure, the carbon nanotube 102 is directly located on the surface of the insulating layer 210, the carbon nanotube 102 is close to the gate electrode 208, the transparent conductive film 106 is far away from the gate electrode 208. As such, the transparent conductive film 106 will not generate shielding effect between the semiconductor structure 104 and the gate electrode 208, and the gate electrode 208 can be used to control the semiconductor element 100 when the light detector 10 is used.

When the light detector 10 further includes a gate electrode 208, the electrical properties of the carbon nanotube 10 and the semiconductor material can be controlled by controlling a voltage on the gate electrode 208 to optimize the performance of the light detector 10. The light detector 10 uses the carbon nanotube 102 as a bottom electrode, the Fermi level of the carbon nanotubes is more easily controlled by the gate electrode 208 due to the special geometry and energy band structure of the carbon nanotubes. Therefore, this semiconductor element 100 in the light detector 10 exhibits a unique property.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A light detector comprising:
a semiconductor element, a first electrode, a second electrode and a current detecting element electrically connected with each other to form a circuit, the semiconductor element comprises:
  a semiconductor structure comprising a P-type semiconductor and an N-type semiconductor overlapped with each other and defining a first surface and a second surface, wherein the P-type semiconductor and an N-type semiconductor contacts with each other to form a P-N junction;
  a single carbon nanotube located on the first surface of the semiconductor structure and oriented along the first surface of the semiconductor structure and there is no other carbon nanotubes located on the first surface, a diameter of the single carbon nanotube ranges from approximately 0.5 nanometers to approximately 150 nanometers;
  a transparent conductive film located on the second surface of the semiconductor structure, wherein the transparent conductive film is formed on the second surface by a depositing method or a coating method, the semiconductor structure is located between the carbon nanotube and the transparent conductive film, and the carbon nanotube, the semiconductor structure and the transparent conductive film are stacked with each other to form a multi-layered stereoscopic structure.

2. The light detector of claim 1, wherein the carbon nanotube is a metallic carbon nanotube.

3. The light detector of claim 2, wherein the carbon nanotube is a single-walled carbon nanotube, and a diameter of the carbon nanotube ranges from 1 nanometer to 5 nanometers.

4. The light detector of claim 1, wherein a thickness of the semiconductor structure ranges from about 1 nanometer to about 200 nanometers.

5. The light detector of claim 1, wherein a material of the P-type semiconductor or the N-type semiconductor is gallium arsenide, silicon carbide, polysilicon, monocrystalline silicon, naphthalene or molybdenum sulfide.

6. The light detector of claim 1, wherein the transparent conductive film is directly formed on the second surface by the depositing method, and the depositing method comprises ion sputtering or magnetron sputtering.

7. The light detector of claim 1, wherein a thickness of the transparent conductive film is in a range from 5 nanometers to 20 nanometers.

8. The light detector of claim 1, wherein a cross-sectional area of the multi-layered stereoscopic structure is in a range from about 0.25 nm to about 1000 nm.

9. The light detector of claim 8, wherein the cross-sectional area of the multi-layered stereoscopic structure is in a range from about 1 $nm^2$ to about 100 $nm^2$.

10. The light detector of claim 1, wherein the first surface of the semiconductor structure is a surface of the P-type semiconductor layer, the second surface of the semiconductor structure is a surface of the N-type semiconductor layer.

11. The light detector of claim 1, wherein the first surface of the semiconductor structure is the surface of the N-type semiconductor layer, the second surface of the semiconductor structure is the surface of the P-type semiconductor layer.

12. The light detector of claim 1, wherein the first electrode is electrically connected with the carbon nanotube, the second electrode is electrically connected with the transparent conductive film.

13. The light detector of claim 1, further comprising a gate electrode and an insulating layer, wherein the insulating layer is located on a surface of the gate electrode.

14. The light detector of claim 13, wherein the semiconductor element, the first electrode, and the second electrode are located on a surface of the insulating layer and separated from the gate electrode via the insulating layer.

15. The light detector of claim 14, wherein in the semiconductor element, the carbon nanotube is directly located on the surface of the insulating layer.

16. The light detector of claim 15, wherein the carbon nanotube is close to the gate electrode, the transparent conductive film is far away from the gate electrode.

17. The light detector of claim 1, wherein a Wan der Waals heterostructure is formed by the multi-layered stereoscopic structure between the carbon nanotube, the semiconductor structure and the transparent conductive film.

18. The light detector of claim 1, wherein a Schottky junction is formed between the carbon nanotube, the semiconductor structure and the transparent conductive film in the multi-layered stereoscopic structure.

\* \* \* \* \*